(12) United States Patent
Gao

(10) Patent No.: US 11,291,143 B2
(45) Date of Patent: Mar. 29, 2022

(54) COOLING DESIGN FOR ELECTRONICS ENCLOSURE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/729,164

(22) Filed: Dec. 27, 2019

(65) Prior Publication Data

US 2021/0204449 A1    Jul. 1, 2021

(51) Int. Cl.
    *H05K 7/20* (2006.01)

(52) U.S. Cl.
    CPC ..... *H05K 7/20754* (2013.01); *H05K 7/20727* (2013.01); *H05K 7/20781* (2013.01)

(58) Field of Classification Search
    CPC ........... H05K 7/20754; H05K 7/20727; H05K 7/20781
    USPC ........................................................ 361/698
    See application file for complete search history.

(56) References Cited

U.S. PATENT DOCUMENTS

| | | | | |
|---|---|---|---|---|
| 3,917,370 A * | 11/1975 | Thornton | ............. | H01R 13/005 439/194 |
| 4,233,645 A * | 11/1980 | Balderes | ............. | H01L 23/3733 174/16.3 |
| 4,720,981 A * | 1/1988 | Helt | ........................ | F25B 40/00 165/80.4 |
| 5,510,954 A * | 4/1996 | Wyler | ........................ | G06F 1/18 360/99.25 |
| 5,907,473 A * | 5/1999 | Przilas | ............... | H05K 7/20345 361/699 |
| 6,657,121 B2 * | 12/2003 | Garner | ............... | H05K 7/20681 174/16.3 |
| 6,942,018 B2 * | 9/2005 | Goodson | ............... | F04B 19/006 165/104.21 |
| 6,992,888 B1 * | 1/2006 | Iyer | ..................... | H01L 23/3732 165/80.4 |
| 7,012,807 B2 * | 3/2006 | Chu | ......................... | G06F 1/20 165/104.33 |
| 7,539,020 B2 * | 5/2009 | Chow | ................ | H05K 7/20727 165/104.21 |
| 7,813,121 B2 * | 10/2010 | Bisson | ............... | H05K 7/20563 361/679.51 |

(Continued)

*Primary Examiner* — Anatoly Vortman
(74) *Attorney, Agent, or Firm* — Womble Bond Dickinson (US) LLP

(57) ABSTRACT

In one embodiment, an electronics enclosure for housing a data processing system includes a number of enclosure panels forming a fully enclosed container to contain electronics, including a first enclosure panel having a liquid cooling component therein and a second enclosure panel having an air cooling component therein. The enclosure is thermally managed by implementing these panels. The first enclosure panel includes an inlet port to receive cooling liquid from an external cooling liquid source, a cooling plate disposed on an inner surface of the first enclosure panel to receive a motherboard of the data processing system and to extract heat from the motherboard using the cooling liquid and an outlet port to return the cooling liquid back to the external liquid source. The second enclosure panel includes a liquid to air heat exchanger to cool air flowing through an air space within the fully enclosed container using at least a portion of the cooling liquid.

13 Claims, 7 Drawing Sheets

(56) References Cited

U.S. PATENT DOCUMENTS

| | | | | |
|---|---|---|---|---|
| 7,905,276 | B2* | 3/2011 | Clough | H01L 23/473 165/80.4 |
| 8,164,901 | B2* | 4/2012 | Neudorfer | H05K 7/20781 361/699 |
| 8,184,436 | B2* | 5/2012 | Campbell | H05K 7/20809 361/700 |
| 8,351,200 | B2* | 1/2013 | Arimilli | H05K 7/20745 361/679.53 |
| 9,483,091 | B2* | 11/2016 | Watanabe | G06F 1/20 |
| 10,225,958 | B1* | 3/2019 | Gao | H05K 7/20772 |
| 2003/0010477 | A1* | 1/2003 | Khrustalev | F28D 15/0266 165/104.33 |
| 2003/0147214 | A1* | 8/2003 | Patel | G06F 1/206 361/699 |
| 2004/0037045 | A1* | 2/2004 | Phillips | F28D 15/0233 361/719 |
| 2004/0100770 | A1* | 5/2004 | Chu | H05K 7/20754 361/698 |
| 2004/0264124 | A1* | 12/2004 | Patel | G06F 1/20 361/679.46 |
| 2005/0231913 | A1* | 10/2005 | Malone | H05K 7/20727 361/698 |
| 2008/0055846 | A1* | 3/2008 | Clidaras | H05K 7/2079 361/679.41 |
| 2009/0086428 | A1* | 4/2009 | Campbell | H05K 7/2079 361/694 |
| 2019/0166724 | A1* | 5/2019 | Moss | H05K 7/20727 |

* cited by examiner

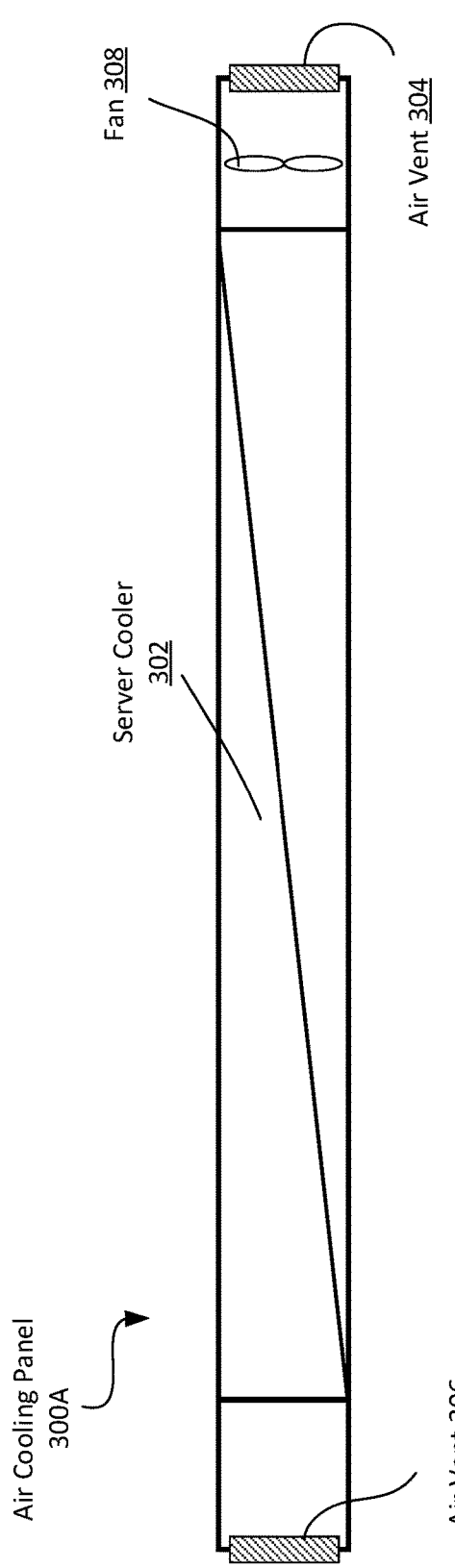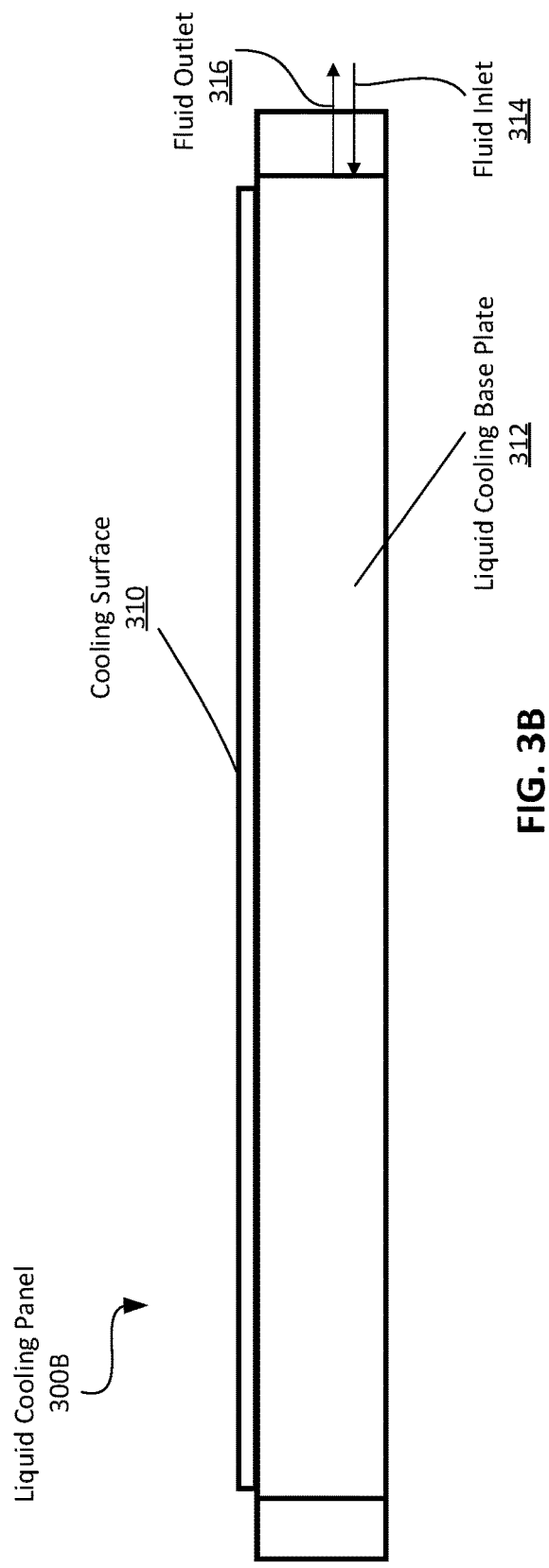
FIG. 3A
FIG. 3B

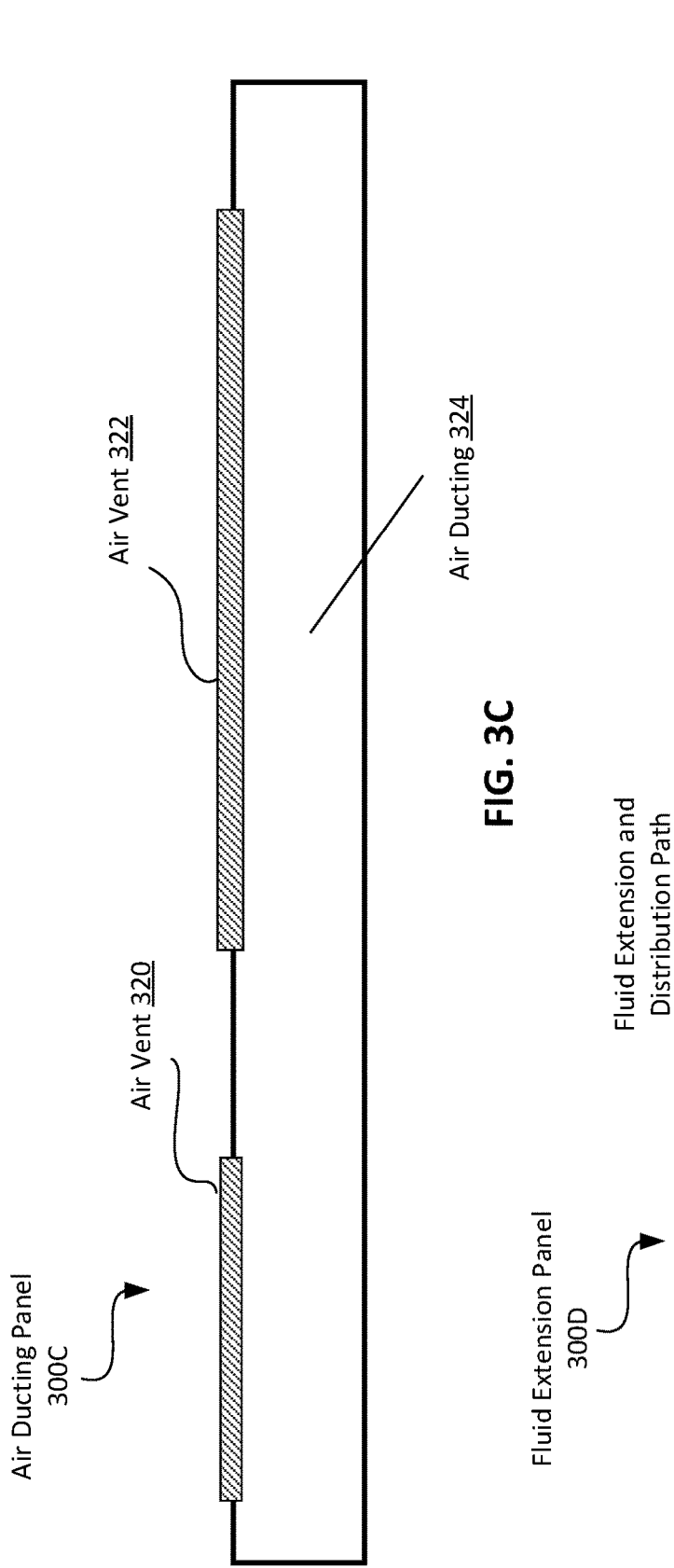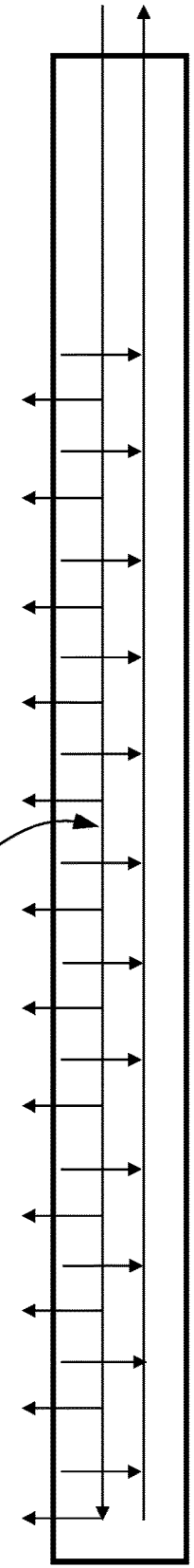
FIG. 3C
FIG. 3D

COOLING DESIGN FOR ELECTRONICS ENCLOSURE

FIELD OF THE DISCLOSURE

Embodiments of the present invention relate generally to data centers. More particularly, embodiments of the invention relate a cooling design for an electronics enclosure.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be an issue with existing cooling systems.

Data centers may be large systems that include two major parts: IT equipment and the facility. These two parts are closely coupled with one another in all phases of operation. However, the lifetime of the facility is generally much longer than the IT equipment that it houses. Therefore, it can be a challenge for the facility to keep up with supporting and satisfying the IT deployment requirements. The difficulties may be compounded when the IT are cooled using both air cooling and liquid cooling techniques.

Additionally, edge computing has become an important and prevalent technology recently, especially in combination with 5G technology. Edge computing requires more compute and storage workload to be processed closer to the end user rather than at a core data center or central cloud environment. For example, in autonomous vehicles multiple sensors are assembled on the vehicle. The data collected by the sensors needs to be processed locally, which requires local vehicle computing hardware. The processing capability requirements for edge computing applications, such as autonomous vehicles, is constantly increasing and the environments in which they are deployed can vary greatly from the very well controlled environment of a data center. Edge computing devices may be deployed in harsh environments, including severe temperatures, humidity, air quality, weather conditions, etc. Therefore, these devices can be deployed in a fully enclosed packaging. However, controlling the thermal environment of the devices with different thermal design power and thermal specifications within a packaging that is fully enclosed becomes a challenge which has attracted a lot of attentions.

BRIEF DESCRIPTION OF THE DRAWINGS

Embodiments of the invention are illustrated by way of example and not limitation in the figures of the accompanying drawings in which like references indicate similar elements.

FIG. 3A shows side view of an air cooling panel for an electronics enclosure according to one embodiment.

FIG. 3B shows a side view of a liquid cooling panel for an electronics enclosure according to one embodiment.

FIG. 3C shows a side view of an air ducting panel for an electronics enclosure according to one embodiment.

FIG. 3D shows a side view of a fluid extension panel for an electronics enclosure according to one embodiment.

DETAILED DESCRIPTION

Figure 1:
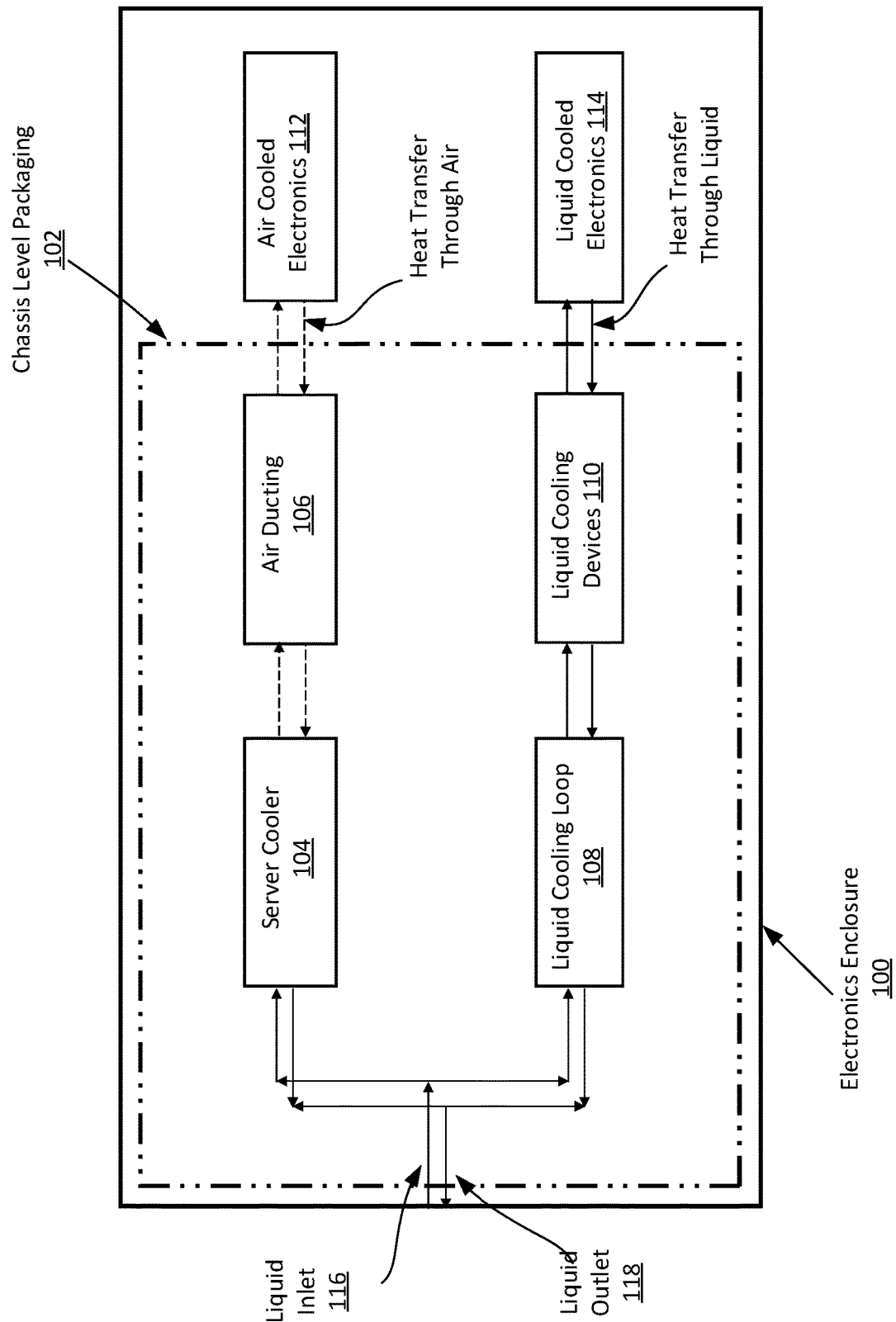
FIG. 1 is a block diagram illustrating a cooling design for an electronics enclosure according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The present disclosure solves the problem of cooling computing hardware in a fully enclosed environment. Embodiments of the disclosure provides a cooling design for a fully enclosed electronics enclosure. Specifically, the disclosure describes a cooling enclosure that uses exchange of a cooling liquid from an external source. The design includes direct liquid cooling loops, an air ducting system for air recirculation, a server cooler and a fluid distribution device. The electronics within the enclosure are cooled by a liquid cooling method, an air cooling method, or a hybrid air plus liquid cooling method. The cooling liquid is used in liquid cooling loops and liquid cooling devices to provide direct liquid cooling. The cooling liquid is also used at the server cooler to cool recirculating air. The components described can be assembled within panels of the enclosure. The components can be assembled in different manners, with different combinations of components in a panel to provide both liquid cooling and air cooling to the fully enclosed electronics enclosure.

According to one embodiment, an electronics enclosure for housing a data processing system includes a number of enclosure panels forming a fully enclosed container to contain a data processing system. The enclosure panels include a first enclosure panel having a liquid cooling component therein and a second enclosure panel having an air cooling component therein. The first enclosure panel includes an inlet port to receive cooling liquid from an external cooling liquid source and a cooling plate having a liquid distribution channel therein. The cooling plate is disposed on an inner surface of the first enclosure panel to receive a motherboard of the data processing system and to extract heat the motherboard using the cooling liquid flowing in the liquid distribution channel. The first enclosure panel also includes an outlet port to return the cooling liquid back to the external liquid source. The second enclosure panel includes a liquid to air heat exchanger embedded therein to cool air flowing through an air space within the fully enclosed container using at least a portion of the cooling liquid.

In one embodiment, the enclosure panels further include a third enclosure panel coupled to the second enclosure panel. The third enclosure panel includes a first air vent to receive cooled air from the second enclosure panel and a second air vent to direct the cooled air received from the second enclosure panel toward the data processing system. In another embodiment, the third enclosure panel includes tubing to provide cooling liquid to the liquid cooling component of the first enclosure panel and the air cooling component of the second enclosure panel.

In one embodiment, the motherboard is mounted on the liquid cooling component of the first enclosure panel. In one embodiment, a liquid cooling device is coupled to the liquid cooling component of the first enclosure panel. The liquid cooling device is positioned on one or more electronic devices of the data processing system located on a top surface of the motherboard. The liquid cooling device extracts heat from the one or more electronic components using at least a portion of the cooling liquid.

In one embodiment, the first enclosure panel and the second enclosure panel are the same panel of the electronics enclosure, which can be understood as a combined enclosure also. In a different embodiment, the first enclosure panel and the second enclosure panel are different panels of the electronics enclosure.

In one embodiment, the second enclosure panel further includes air vents on two opposite ends of the second enclosure panel to provide an air inlet and outlet to the liquid to air heat exchanger and a fan to pull air through the second enclosure panel and to circulate air through the enclosure.

FIG. 1 is a system diagram of a cooling design for an electronics enclosure according to one embodiment. FIG. 1 presents a design concept diagram. Since the enclosure is fully enclosed, no external air is permits to enters the enclosure. The entire enclosure only receives liquid cooling sources from external resource. Therefore, the only cooling medium is the liquid cooling fluid recirculating through the enclosure. The cooling fluid enters to the enclosure and is used for different cooling design. One loop is designed for the liquid cooling loop. The liquid cooling loop is utilized for pure liquid devices and electronics. This means the heat generated by the electronics or the heat captured by the cooling devices only transferred within the fluid in the cooling loop.

Another loop is design for cooling the recirculating air. Since there will be many different types of electronics packaged on the motherboard, with different from factors, different functions, different power density and heat densities, it is a challenge to apply liquid cooling devices on all of them. Even though it may be a feasible solution technically, but the corresponding cost and reliability will be some other major challenges need to be solved. Therefore, the design considers using internal recirculating airflow for cooling some of the electronics, such as low power density electronics in combination with liquid cooling. In this second loop the liquid is used to cool the server cooler, which can be understood as a liquid to air heat exchanger. Air ducting system is used for managing the airflow flowing through the electronics region and the server cooler to constantly extracting the heat to the liquid through air.

In one embodiment, the two loops can be designed in series. In another embodiment, multiple loops can be designed within the electronics enclosure.

In one embodiment, referring to FIG. 1, the cooling design includes a chassis level packaging 102 that provides cooling for air cooled electronics 112 and liquid cooled electronics 114. The chassis level packaging 102 can include enclosure panels to enclose a data processing system. The enclosure may be fully enclosed, allowing no external air to enter the enclosure. At least one of the enclosure panels includes a server cooler 104 and at least one of the enclosure panels includes a liquid cooling device 110. The server cooler 104 can be a liquid to air heat exchanger to extract heat from air circulating within the electronics enclosure 100. The chassis level packaging 102 further includes air ducting 106 to circulate and direct air flow within the electronics enclosure 100. The air ducting 106 can be included within an enclosure panel of the chassis level packaging 102. The server cooler 104 and air ducting 106 therefore provides for air cooling (heat transfer through air) to the air cooled electronics 112 by cooling recirculating air within the enclosure. The air cooled electronics 112 may include low power density devices, such as a PCIE switch.

The liquid cooling devices 110 of the chassis level packaging 102 can be a device with one or more liquid distribution channels through which a cooling liquid flows to extract heat generated by liquid cooled electronics 114. The liquid cooled electronics 114 may include high performance processors or other electronic devices with a high power density. The liquid cooling loop 108 can provide a cooling liquid to and from the liquid cooling devices 110. The cooling loop 108 may include piping that carries the cooling liquid from a liquid inlet 116 of the electronics enclosure 100 to the liquid cooling devices 110 and back to a liquid outlet 118 of the electronics enclosure 100. In some embodiments, the liquid cooling loop 108 additionally provides the cooling liquid to the server cooler 104 to provide for liquid to air heat exchange.

Figure 2:
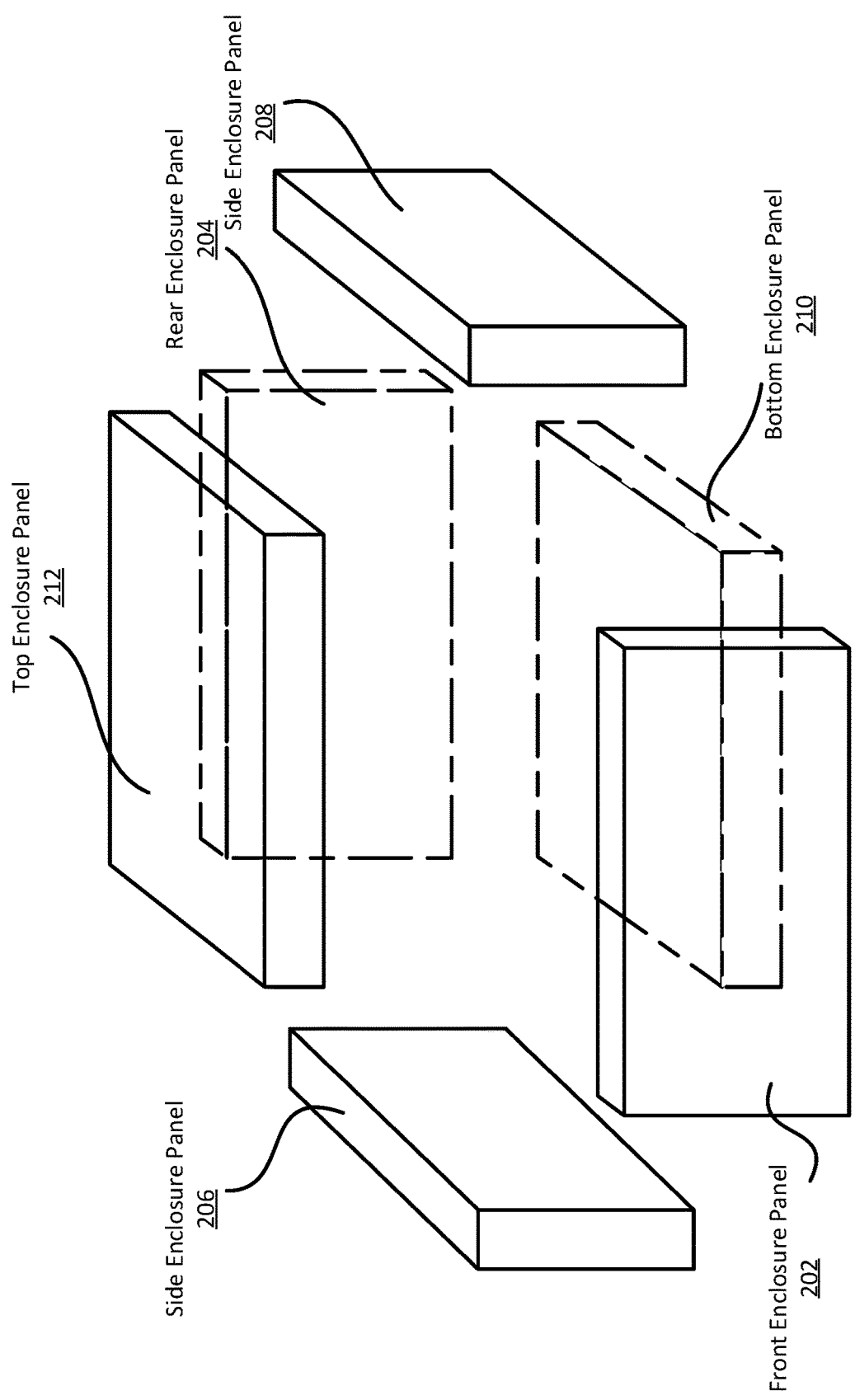
FIG. 2 is an exploded view of an electronics enclosure according to one embodiment.

FIG. 2 is an exploded view of an electronics enclosure (such as electronics enclosure 100 of FIG. 1) according to one embodiment. FIG. 2 shows a simplified three-dimensional (3D) packaging design for the enclosure. The electronics as well as the motherboard will be packaged using multiple panels to form a fully enclosed environment. The enclosure can be represented as six panels as shown in the FIG. 2. Even though these six panels are represented as separate pieces as shown, some of them can be designed as one single piece in actual product.

The cooling functions and cooling products are packaged within this panels. This means the system shown in the diagram in FIG. 1 will be realized using the panels. Using the method presented here, the cooling system and the corresponding components and devices can be preassembled with the enclosure chassis, and it can be separated with the electronics as much as possible. In some of the actual use cases, the electronics board may vary dramatically especially during the design phase, therefore, the current design limits the impact of the electronics cooling design on the system design. Meanwhile, the cooling configurations as well as the cooling system design and specifications can be adjusted easily without an impact on the electronics system. This significantly improve the design and system upgrading efficiency.

Referring to FIG. 2, according to one embodiment, the electronics enclosure includes a front enclosure panel 202, a rear enclosure panel 204, two side enclosure panels 206 and 208, a bottom enclosure panel 210 and a top enclosure panel 212. Each of the enclosure panels 202-212 may include one or more cooling components embedded within and/or on a surface of the panel. In some embodiments, one or more of the enclosure panels 202-212 may be a flat panel that does not include a cooling component. For example, one or more panels can simply be a flat sheet metal enclosure panel. Thus, any number of the enclosure panels 202-212 can include cooling components while others do not. In some embodiments, enclosure panels that do not include cooling components may include additional insulation to provide a more stable environment within the electronics enclosure. Although depicted as individual panels, in some embodiment two or more of the panels may be designed as a single structure.

Figure 4:
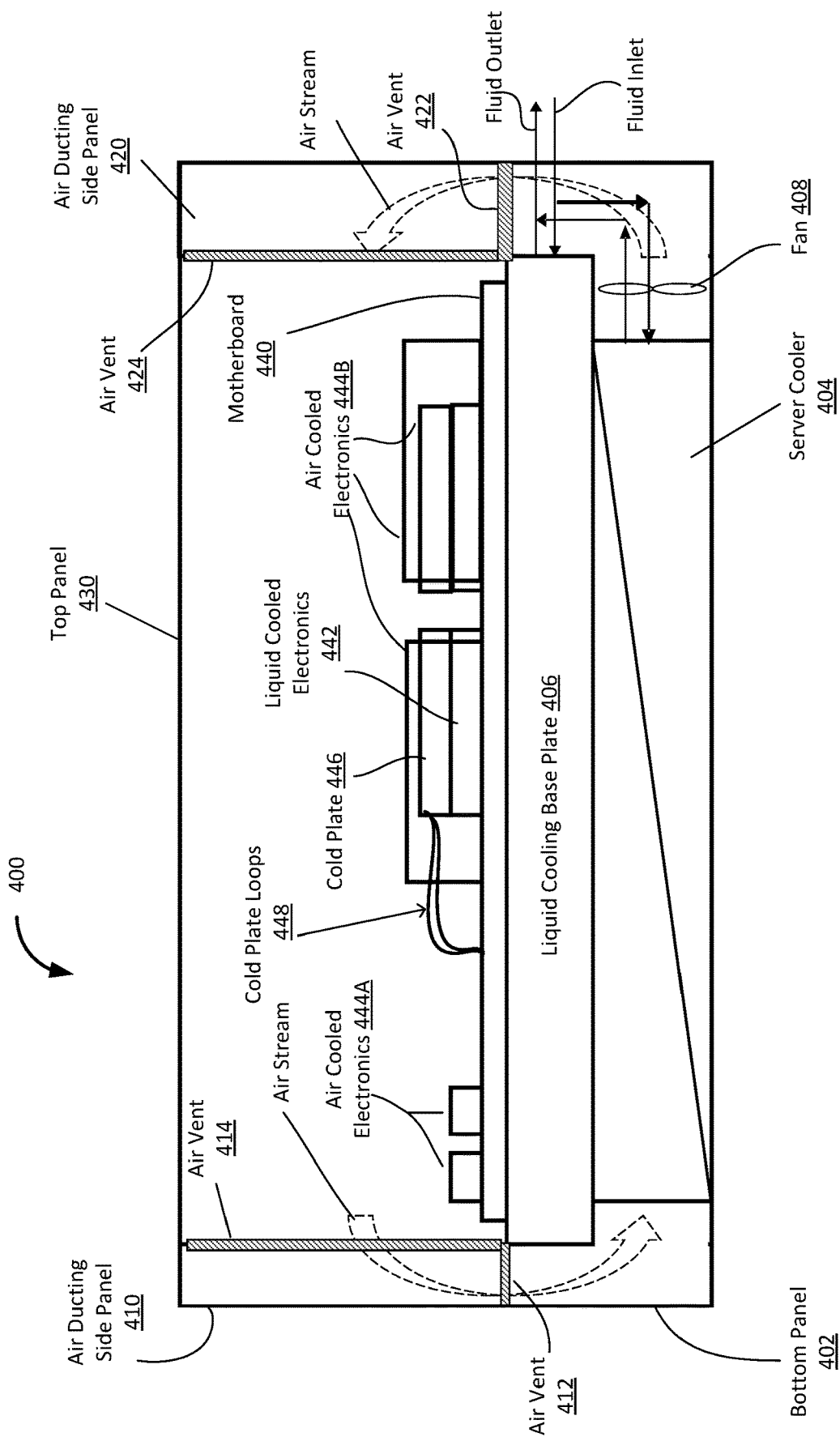
FIG. 4 shows a side view of a cooling design for an electronics enclosure according to another embodiment.
Figure 5:
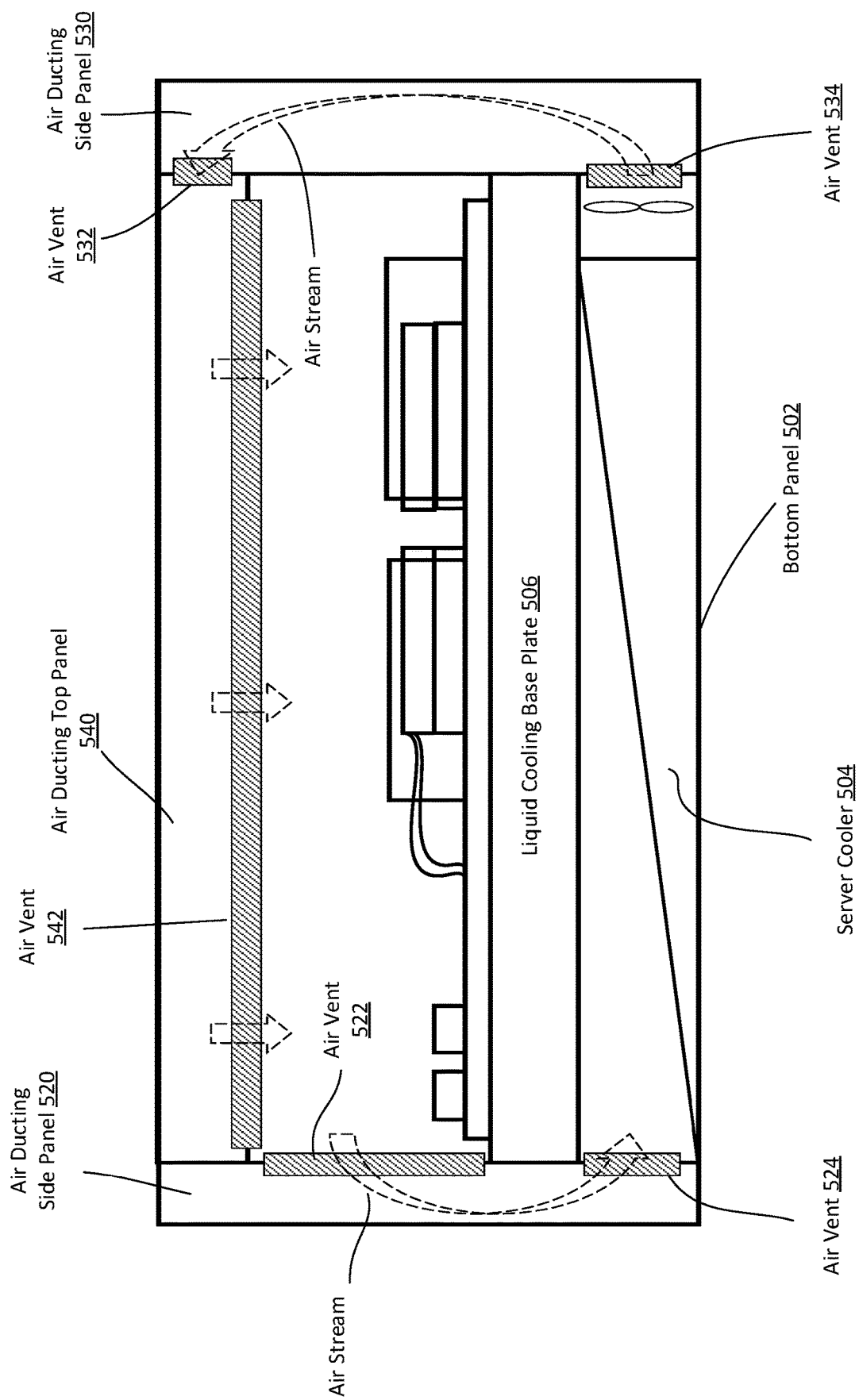
FIG. 5 shows a side view of cooling design for an electronics enclosure according to another embodiment.
Figure 6:
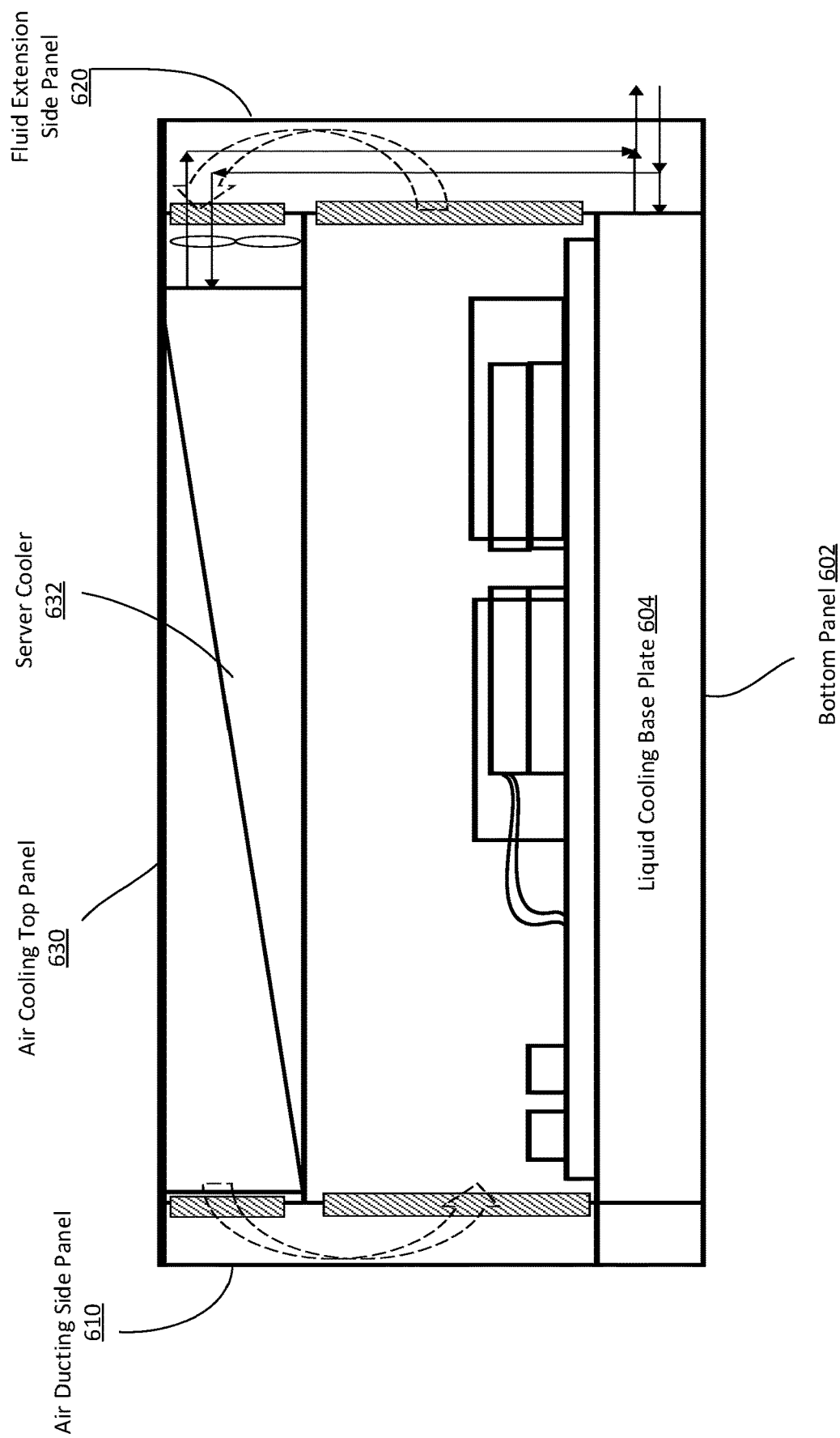
FIG. 6 shows a system using a cooling design for an electronics enclosure according to another embodiment.

As an example, bottom enclosure panel 210 can include a liquid cooling component on an inner surface of the bottom enclosure panel and an air cooling component embedded within the panel. Side enclosures 206 and 208 can additionally include venting that directs air to and from the air cooling component of the bottom enclosure panel 210 to be cooled and to direct airflow and circulation through the electronics enclosure. It should be noted that cooling components may be embedded within any of the enclosure panels 202-212. Furthermore, more than one liquid cooling component can be included within the enclosure panels 202-212 (e.g., both bottom enclosure 210 and side enclosure 208 may each include a liquid cooling component). More than one air cooling component can also be included (e.g., both the bottom enclosure panel 210 and the top enclosure panel 212 may include an air cooling component). The cooling components of the electronics enclosure can be organized within the enclosure panels 202-212 in many possible configurations (FIGS. 4-6 below illustrate a representative few).

FIG. 3A depicts a side view of an air cooling panel 300A that may be included in a cooling design for an electronics enclosure. FIG. 3A shows an air cooling panel, the air cooling panel can be implemented on any side of the panel. It is recommended to use on a top or bottom panel for better air flow management. The key feature is the liquid to air heat exchanger assembled inside of the panel. It can be understood as a server cooler. It can be either a liquid to air heat exchanger or any other air cooling devices. Fans or fan system may be assembled within the panel. With the fans separated from the motherboard or electronics, the reliability is increased since the variation impact caused by the fan operating is limited. Since the panel is equipped with the server cooler, it is also functioning as an air cooling panel. On an air cooling panel, openings are included for air entering and existing the panel. Air vents are assembled on the opening for air stream management. The server cooler requires cooling fluid supply and return to connect to them which is not shown.

Referring to FIG. 3A, according to one embodiment, the air cooling panel 300A includes a server cooler 302, an air vent 304 on one end of the panel and an air vent 306 on the end of the panel opposition air vent 304. The air cooling panel 304A further includes a fan 308 to draw air through the server cooler 302. The air may flow in through air vent 304 to the server cooler 302 in which the air is cooled. The cooled air may then flow out of the air cooling panel 300A through air vent 306. The cooled air may exit the air cooling panel 300A to the enclosure containing the data processing system. Alternatively, the cooled air may be directed through additional air ducting. The air cooling panel 300A may be implemented on any side of the enclosure.

The server cooler 302 can be a liquid to air heat exchanger, or any other cooling device, which extracts heat from air flowing through the air cooling panel 300A using a cooling liquid. The cooling liquid may be received at the server cooler 302 from a cooling liquid source external to the electronics enclosure. The cooling liquid then flows through the server cooler 302, extracting heat from the air and is returned to the cooling liquid source.

FIG. 3B depicts a liquid cooling panel 300B that may be included in a cooling design for an electronics enclosure according to one embodiment. FIG. 3B shows a liquid cooling panel, which the liquid cooling plate or liquid cooling loops/components are assembled. The cooling plate can be a motherboard cooling cold plate with micro-water fin structural inside it or any other structural. On the cooling plate, fluid expansion ports or additional fluid distribution manifolds are assembled if needed. The cooling surface is where the motherboard sitting on through a thermal pad. It the current proposal, it is recommended to be assembled the motherboard over the top of the liquid cooling panel for higher reliability consideration. This means the liquid cooling panel is recommended to be used as the base panel. The enclosure main fluid supply and return ports are assembled on this panel too.

Referring to FIG. 3B, according to one embodiment, the liquid cooling panel 300B includes a liquid cooling base plate 312 and a cooling surface 310. The liquid cooling panel 300B can include the main fluid supply and return for the electronics enclosure. A fluid inlet 316 and a fluid outlet 316 provides a cooling liquid to and from the liquid cooling base plate 312 of the liquid cooling panel 300B. The liquid cooling base plate 312 may have a liquid distribution channel therein distributing a cooling liquid through the liquid cooling base plate 312. The liquid cooling base plate 312 may include micro water fins to increase conductive heat transfer area from the cooling surface 310 to the cooling liquid.

The cooling surface 310 may be exposed to an inner surface of the liquid cooling panel 300B to receive a motherboard of the data processing system and to extract heat from the motherboard using the cooling liquid flowing in the liquid distribution channel. A thermal pad or thermal interface material may be placed between the cooling surface 310 and the motherboard. The fluid inlet 314 may receive the cooling liquid from a source external to the electronics enclosure. The cooling liquid flows through the liquid distribution channel of the liquid cooling base plate 312, extracting heat produced by electronics of the data processing system. The cooling liquid may then be returned to the cooling liquid source via the fluid outlet 316. The liquid cooling panel 300B may also include one or more fluid expansion ports or fluid distribution manifolds to extend fluid distribution to other cooling devices.

FIG. 3C depicts an air ducting panel 300C that may be included in a cooling design for an electronics enclosure according to one embodiment. FIG. 3C shows an air ducting panel. The air ducting panel is used for ducting the airflow and connecting the air path between the motherboard region and the air cooling panel. Therefore, opening and corresponding air vents are used on these panels. Note that since these panels are preassembled, therefore, additional structural such as air baffle may be added for better air flow arrangement or for avoiding airflow vortices.

Referring to FIG. 3C, according to one embodiment, the air ducting panel 300C includes air vents 320 and 322 along with air ducting 324 embedded therein. The air vents 320 and 322 provide for air to be moved into and out of the air ducting 324. The air ducting panel 300C may be used in the cooling design for an electronics enclosure to allow movement of air between the server cooler 302 of the air cooling panel 300A and the inside of the enclosure containing the data processing system. For example, air vent 320 may receive cooled air from air vent 306 of the air cooling panel 300A and provide the cooled air to the enclosure through air vent 322. Additional structures, such as an air baffle, may be added to the air ducting panel 300C provide additional air flow management.

FIG. 3D depicts a fluid extension panel 300D that may be included in a cooling design for an electronics enclosure according to one embodiment. FIG. 3D shows a fluid extension panel where the fluid distribution, fluid hoses, connectors or additional fluid piping/connecting are assembled. This is an optional panel in a system, but it is used for some use cases, such as when the air cooling panel and liquid cooling panel are separated in different panels. The fluid extension panel connected to the liquid cooling panel through the fluid inlet and outlet ports.

Referring to FIG. 3D, according to one embodiment, fluid extension panel 300D includes fluid extension and distribution paths 330. The fluid extension and distribution paths 330 may include fluid piping, hoses, and/or other connectors to carry a cooling liquid from an external cooling liquid source to one or more liquid cooling devices (e.g., cooling plates) and/or air cooling devices (e.g., liquid to air heat exchangers). In particular, the fluid extension panel 300D may be included when the air cooling panel 300A and the liquid cooling panel 300B are different panels of the enclosure. The fluid extension panel 300D may include a number of extension ports to which the liquid cooling devices or air cooling devices may be connected.

FIG. 4 depicts one example of a cooling design for an electronics enclosure 400 according to one embodiment. It can be seen that both air cooled electronics and liquid cooled electronics are packaged on the motherboard within the enclosure. In this design, two air ducting panels are used as the side panels. The top panel is a pure panel. The liquid cooling panel and air cooling panel are both assembled at the bottom of the enclosure and they are considered as one single panel. The airflow is used for cooling the air cooled electronics pathing through the central region. Then the airflow enters the air ducting panel, the bottom panel at where the hot air stream is cooled, the air ducting panel on the other side and then enters the central region again. The liquid cooling electronics are cooled using cold plates as examples. The cooling fluid loops for the cold plate, including the supply and return are connected to the cooling plate. It need to be motioned that different cooling devices not just cold plate can be used in the design. In addition, the fluid cooling loops can be assembled with either the cold plate or the liquid cooling plate based on actual use cases.

Referring to FIG. 4, in one embodiment, the electronics enclosure 400 includes a bottom panel 402 with a server cooler 404 and a liquid cooling base plate 406, two air ducting side panels 410 and 420, and a top panel 430. The enclosure 400 may further include a front and a back enclosure panel (not depicted), creating a fully enclosed space within the enclosure. The server cooler 404 can be a liquid to air heat exchanger which extracts heat from air flowing through the bottom panel 402 using a cooling liquid. The cooling liquid may be received at the server cooler 404 from a cooling liquid source external to the electronics enclosure. The cooling liquid flows through the server cooler 404, extracting heat from the air, and is returned to the cooling liquid source.

The liquid cooling base plate 406 may have a liquid distribution channel therein distributing a cooling liquid through the liquid cooling base plate 406. A cooling surface of the liquid cooling base plate 406 may be exposed to an inner surface of the bottom panel 402 to receive a motherboard 440 of the data processing system and to extract heat from the motherboard 440 using the cooling liquid flowing in the liquid distribution channel. A fluid inlet of the liquid cooling baseplate 406 may receive the cooling liquid from a source external to the electronics enclosure. The cooling liquid flows through the liquid distribution channel of the liquid cooling base plate 406, extracting heat produced by electronics of the data processing system. The cooling liquid may then be returned to the cooling liquid source via a fluid outlet of the liquid cooling base plate 406.

Liquid cooled electronics 442 and air cooled electronics 444A and 444B (collectively referred to as air cooled electronics 444) are attached to the motherboard 440. Liquid cooled electronics 442 may include high performance processors, or other components with high power density. Because the liquid cooled electronics 442 have a higher power density they produce a large amount of heat that may necessitate the use of liquid cooling methods, such as cold plate 446, to maintain the thermal environment within an operational range. The cold plate 446 may be attached directly to the liquid cooled electronics 442. The cold plate 446 may be connected to the liquid cooling base plate 406 through cold plate loops 448 to receive and return cooling liquid from the liquid cooling base plate 406.

Air cooled electronics 444 may include lower power density devices, such as a PCIE switch. The air cooled electronics 444 may be cooled using air that is circulating through the electronics enclosure. As depicted in FIG. 4, the air stream may be circulated through the enclosure with one or more fans 408. The air stream may flow through the enclosure to the bottom panel 402 through air vents 414 and 412 of the air ducting side panel 410. The air stream then flows through the server cooler 404 of the bottom panel 402 where the air is cooled. The air stream then flows out of the bottom panel 402 and back to the enclosure through air vents 422 and 424 of the air ducting side panel 420.

FIG. 5 depicts another example of a cooling design for an electronics enclosure 500 according to one embodiment. FIG. 5 shows the cooling package design using three air ducting panels and one bottom panel. The other side panels are just pure chassis panels, maybe with some thermal insulation structures or materials. The three air ducting channels with different opening and air venting design create an air flow streaming pattern within the enclosure. Again, the bottom panel is equipped with both the liquid cooling panel function and air cooling panel function. It needs to be mentioned that since the main fluid supply and return are designed on the liquid cooling panel, the server cooler liquid cooling loop will be connected internally with the cooling plate.

Referring to FIG. 5, in one embodiment, the electronics enclosure 500 includes a bottom panel 502 with a server cooler 504 and a liquid cooling base plate 506, two air ducting side panels 520 and 530, and an air ducting top panel 540. The enclosure 500 may further include a front and back enclosure panel (not depicted), creating a fully enclosed space within the enclosure.

Liquid cooling base plate 506 and server cooler 504 may be the same or similar to liquid cooling base plate 406 and 404 of FIG. 4, respectively. The liquid cooling base plate 506 and the server cooler 504 may exchange a cooling liquid internally. The air stream of FIG. 5 takes a different path through the enclosure due to the addition of the air ducting top panel 540. The air stream travels through the enclosure to the server cooler 504 through air vents 522 and 524 of the air ducting side panel 520. The air stream is then cooled by the server cooler 504. The air stream containing cooled air then travels through the air ducting side panel 530 via air vents 534 and air vent 532 to the air ducting top panel 540. The air stream is then directed down out of the air ducting top panel 540 through air vent 542 into the enclosure and toward the motherboard.

FIG. 6 depicts another example of a cooling design for an electronics enclosure 600 according to one embodiment. FIG. 6 shows a design using an air cooling panel on the top and an air ducting channel on the side. The liquid cooling panel is used at the bottom and connects to the external cooling sources. On the other side of the panel, a fluid extension panel is used for additional fluid distribution and piping for the enclosure. it can be seen that the fluid supply and return loop are designed within this panel for the air cooling panel and the server cooler inside it.

Referring to FIG. 6, in one embodiment, the electronics enclosure 600 includes a liquid cooling bottom panel 602 with a liquid cooling base plate 604, an air ducting side panel 610, a fluid extension side panel 620, and an air cooling top panel 630 with a server cooler 632 embedded therein.

The liquid cooling base plate 604 may be the same or similar to liquid cooling base plate 404 of FIG. 4. Thus, a motherboard can be attached to a cooling surface of the liquid cooling base plate 604 to extract heat from the motherboard. Additionally, server cooler 632 may be the same or similar to server cooler 406 of FIG. 4. However, server cooler 632 is embedded in the air cooling top panel 630 rather than in the bottom panel 602. A fluid extension side panel 620 includes tubing to provide a cooling liquid to and from the server cooler 632. The fluid extension side panel 620 may additionally act as an air ducting panel as well. The air stream of FIG. 6 flows through the enclosure to the air cooling top panel 630 through vents of the fluid extension side panel. The air stream then flows through the server cooler 632 where the air is cooled using a cooling liquid. The air stream then exits air cooling top panel 630 and is returned to the enclosure through vents of the air ducting side panel 610.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronics enclosure for housing a data processing system, comprising:
a plurality of enclosure panels forming a fully enclosed container to contain the data processing system, including a first enclosure panel having a liquid cooling component therein and a second enclosure panel having an air cooling component therein,
wherein the first enclosure panel comprises:
an inlet port to receive a cooling liquid from an external cooling liquid source,
a cooling plate having a liquid distribution channel therein and disposed on an inner surface of the first enclosure panel to receive a motherboard of the data processing system and to extract heat from the motherboard using the cooling liquid flowing in the liquid distribution channel, and
an outlet port to return the cooling liquid back to the external cooling liquid source; and
wherein the second enclosure panel comprises:
a liquid to air heat exchanger embedded therein to cool air flowing through an air space within the fully enclosed container using at least a portion of the cooling liquid, wherein the second enclosure panel further comprises a fan to pull air through the second enclosure panel and to circulate air through the electronics enclosure, wherein the second enclosure panel is positioned underneath with the first enclosure panel to receive the cooling liquid wherein the first enclosure panel and the second enclosure panel are integrated as a single enclosure panel of the electronics enclosure.

2. The electronics enclosure of claim 1, wherein the plurality of enclosure panels further include a third enclosure panel coupled to the second enclosure panel, the third enclosure panel comprising:
a first air vent to receive cooled air from the second enclosure panel; and
a second air vent to direct the cooled air received from the second enclosure panel toward the data processing system.

3. The electronics enclosure of claim 1, wherein the plurality of enclosure panels further include a third enclosure panel coupled to the first enclosure panel and the second enclosure panel, the third enclosure panel comprising:
a tubing to provide the cooling liquid to the liquid cooling component of the first enclosure panel and to the air cooling component of the second enclosure panel.

4. The electronics enclosure of claim 1, wherein the motherboard is mounted on the liquid cooling component of the first enclosure panel.

5. The electronics enclosure of claim 1, further comprising a liquid cooling device coupled to the liquid cooling component of the first enclosure panel, wherein the liquid cooling device is to be positioned on one or more electronic devices of the data processing system located on a top surface of the motherboard, the liquid cooling device to extract heat from the one or more electronic devices using at least the portion of the cooling liquid.

6. The electronics enclosure of claim 1, wherein the second enclosure panel further comprises:
air vents on two opposite ends of the second enclosure panel to provide an air inlet and an air outlet to the liquid to air heat exchanger.

7. The electronics enclosure of claim 1, wherein the second enclosure panel is combined together with the first enclosure panel to receive the cooling liquid.

8. The electronics enclosure of claim 7, further comprising:
a third enclosure panel coupled to a first side of the second enclosure panel, the third enclosure panel having a first air duct channel therein; and
a fourth enclosure panel coupled to a second side of the second enclosure panel, the fourth enclosure panel having a second air duct channel therein, wherein the first and the second air duct channels are configured to circulate air from the air space of the fully enclosed container through the second enclosure panel.

9. An edge computing system, comprising:
a data processing system having one or more processors and memory disposed on a motherboard; and a fully enclosed container containing the data processing system therein, wherein the fully enclosed container comprises:
   a plurality of enclosure panels forming the fully enclosed container to contain the data processing system, including a first enclosure panel having a liquid cooling component therein and a second enclosure panel having an air cooling component therein,
   wherein the first enclosure panel comprises:
      an inlet port to receive a cooling liquid from an external cooling liquid source,
      a cooling plate having a liquid distribution channel therein and disposed on an inner surface of the first enclosure panel to receive the motherboard of the data processing system and to extract heat from the motherboard using the cooling liquid flowing in the liquid distribution channel, and
      an outlet port to return the cooling liquid back to the external cooling liquid source; and
   wherein the second enclosure panel comprises:
      a liquid to air heat exchanger embedded therein to cool air flowing through an air space within the fully enclosed container using at least a portion of the cooling liquid, wherein the second enclosure panel further comprises a fan to pull air through the second enclosure panel and to circulate air through an electronics enclosure, wherein the second enclosure panel is positioned underneath with the first enclosure panel to receive the cooling liquid, wherein the first enclosure panel and the second enclosure panel are integrated as a single enclosure panel of the electronics enclosure.

10. The edge computing system of claim 9, wherein the plurality of enclosure panels further include a third enclosure panel coupled to the second enclosure panel, the third enclosure panel comprising:
   a first air vent to receive cooled air from the second enclosure panel; and
   a second air vent to direct the cooled air received from the second enclosure panel toward the data processing system.

11. The edge computing system of claim 9, wherein the plurality of enclosure panels further include a third enclosure panel coupled to the first enclosure panel and the second enclosure panel, the third enclosure panel comprising:
   a tubing to provide the cooling liquid to the liquid cooling component of the first enclosure panel and to the air cooling component of the second enclosure panel.

12. The edge computing system of claim 9, wherein the motherboard is mounted on the liquid cooling component of the first enclosure panel.

13. The edge computing system of claim 9, wherein the fully enclosed container further comprises a liquid cooling device coupled to the liquid cooling component of the first enclosure panel, wherein the liquid cooling device is to be positioned on one or more electronic devices of the data processing system located on a top surface of the motherboard, the liquid cooling device to extract heat from the one or more electronic devices using at least the portion of the cooling liquid.

* * * * *